United States Patent [19]

Yamada et al.

[11] Patent Number: 4,868,827
[45] Date of Patent: Sep. 19, 1989

[54] DIGITAL DATA PROCESSING SYSTEM

[75] Inventors: Kazuya Yamada, Yokosuka; Kazunori Nishikawa, Tokyo; Koji Tanaka, Yokohama; Yasuhiro Yamada, Yokosuka, all of Japan

[73] Assignee: Victor Company of Japan, Ltd., Japan

[21] Appl. No.: 89,554

[22] Filed: Aug. 26, 1987

[30] Foreign Application Priority Data

Aug. 26, 1986 [JP] Japan ............................ 61-199522

[51] Int. Cl.⁴ ............................................ G06F 11/08
[52] U.S. Cl. .................................. 371/37.5; 371/39.1
[58] Field of Search ...................... 371/37, 38, 39, 40

[56] References Cited

U.S. PATENT DOCUMENTS

| | | | |
|---|---|---|---|
| 4,667,326 | 5/1987 | Young | 371/38 |
| 4,680,764 | 7/1987 | Suzuki | 371/38 |
| 4,682,332 | 7/1987 | Okamoto | 371/38 |
| 4,763,332 | 8/1988 | Glover | 371/38 |

OTHER PUBLICATIONS

"Error-Correcting Codes", W. Wesley Peterson+E. J. Waldon, Jr., Viii-Xi, pp. 268-309.

Primary Examiner—Michael R. Fleming
Attorney, Agent, or Firm—Lowe, Price, LeBlanc, Becker & Shur

[57] ABSTRACT

Parity is generated in accordance with digital data. The parity is added to the digital data to produce a coded signal. The coded signal is recorded. The recorded signal is reproduced. The reproduced signal is decoded and code word errors are corrected to reproduce the digital data. The number of symbols of the digital data equals $m-(2n+1)$. The number of symbols of the parity equals $2n+1$. Each of the symbols has l bits. The characters m and n denote natural numbers. The character l denotes a natural number equal to or greater than 2. Coding and decoding are performed by use of new-type Reed-Solomon code.

9 Claims, 6 Drawing Sheets

DIGITAL DATA PROCESSING SYSTEM

BACKGROUND OF THE INVENTION

This invention relates to a digital data processing system using a Reed-Solomon code for error detection and correction.

Some digital data processing systems, such as digital data communication systems, pulse-code-modulation (PCM) recording and reproducing systems, and digital audio systems, handle digital signals in unit of an encoded block including a data portion and an added parity check portion. The parity check portion is added to detect and correct data errors. Reed-Solomon codes are widely used in such a block-encoding-type handling of digital signals. Digital data systems using Reed-Solomon codes tend to be complicated.

SUMMARY OF THE INVENTION

It is an object of this invention to provide a simple digital data processing system using a Reed-Solomon code.

In a digital data processing system of this invention, parity is generated in accordance with digital data. The parity is added to the digital data to produce a coded signal. The coded signal is recorded. The recorded signal is reproduced. The reproduced signal is decoded and code word errors are corrected to reproduce the digital data. The number of symbols of the digital data equals $m-(2n+1)$. The number of symbols of the parity equals $2n+1$. Each of the symbols has l bits. The characters m and n denote natural numbers. The character l denotes a natural number equal to or greater than 2. Coding and decoding are performed by use of Reed-Solomon code designed as follows. A parity generator polynomial G(x) of the Reed-Solomon code is given as:

$$G(x) = (x - \alpha^{-n}) \cdot (x - \alpha^{-(n-1)}) \cdots$$
$$(x - \alpha^{-1}) \cdot (x - 1) \cdot (x - \alpha^1) \cdots$$
$$(x - \alpha^{n-1}) \cdot (x - \alpha^n)$$

A code word W of the Reed-Solomon code is given as:

$$W = [C_{m-1}, \ldots, C_1, C_0];$$

Calculation coefficients in coding and decoding which are obtained via the parity generator polynomial are expressed as coefficient of x in the following equation:

$$G(x) = x^{2n+1} + A_1 x^{2n} + \ldots + A_n x^{n+1} + A_n x^n + A_{n-1} x^{n-1} + A_1 x + 1;$$

A check matrix H0 of the Reed-Solomon code is given as:

$$H_0 = \begin{bmatrix} \alpha^{-(m-1)\cdot n}, & \alpha^{-(m-2)\cdot n}, & \ldots, & 1 \\ \alpha^{-(m-1)\cdot(n-1)}, & \alpha^{-(m-2)\cdot(n-1)}, & \ldots, & 1 \\ \vdots & \vdots & & \vdots \\ 1, & 1, & \ldots, & 1 \\ \vdots & \vdots & & \vdots \\ \alpha^{(m-1)\cdot(n-1)}, & \alpha^{(m-2)\cdot(n-1)}, & \ldots, & 1 \\ \alpha^{(m-1)\cdot n}, & \alpha^{(m-2)\cdot n}, & \ldots, & 1 \end{bmatrix}$$

where the character $\alpha$ represents a primitive root of a Galois field $GL(2^l)$.

DESCRIPTION OF THE PREFERRED EMBODIMENT

Figure 1:
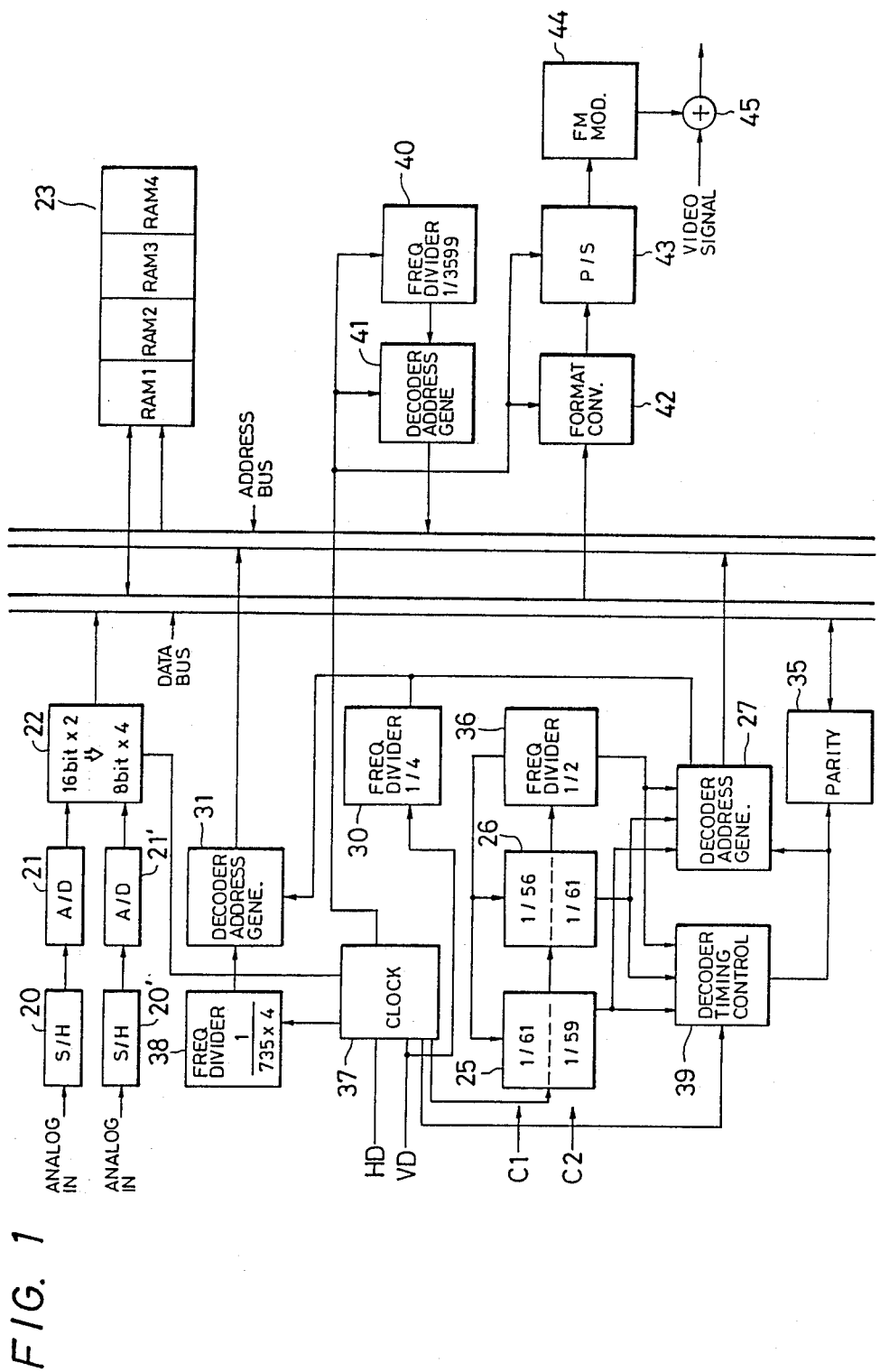
FIG. 1 is a block diagram of a coding apparatus included in a digital data system according to an embodiment of this invention.

This invention uses a Reed-Solomon code having a cord word length m, $m-(2n+1)$-data segments, and $(2n+1)$-parity check segments In other words, the number of data symbols in a code word equals $m-(2n+1)$ and the number of parity check symbols in a code word equals $2n+1$. Each word or segment has l bits. The letters m and n denote natural numbers and the letter l denotes a natural number equal to or greater than 2. The parity check segments are sometimes simply referred to as the parity or parities in the description of the embodiment of this invention. The cord word of this Reed-Solomon code is defined as:

$$W = [D_{m-(2n+1)}, D_{m-(2n+2)}, \ldots, D_1, P_{2n+1}, \ldots, P_1] \quad (1)$$

where the symbols $D_{m-(2n+1)}, D_{m-(2n+2)}, \ldots, D_1$ represent data segments and the symbols $P_{2n+1}, \ldots, P_1$ represent parity check segments. In this Reed-Solomon code, since the number of the parity symbols equals $(2n+1)$ and is odd, the parity generating polynomial G(x) can be defined in a symmetrical form as:

$$G(x) = (x - \alpha^{-n}) \cdot (x - \alpha^{-(n-1)}) \cdot \ldots \cdot \quad (2)$$
$$(x - 1) \cdot \ldots \cdot (x - \alpha^{n-1}) \cdot$$
$$(x - \alpha^n)$$
$$= \prod_{k=-n}^{n} (x - \alpha^k)$$

where the character $\alpha$ represents a primitive root of a Galois field GL($2^l$). The parity generator polynomial G(x) is symmetrical with respect to exponent of the value $\alpha$. In connection with the definition of the parity generator polynomial G(x), the parity check matrix $H_0$ in this Reed-Solomon code is given by the following equation:

$$H_0 = \begin{pmatrix} \alpha^{-(m-1)\cdot n} & , & \alpha^{-(m-2)\cdot n} & , & \ldots, & 1 \\ \alpha^{-(m-1)\cdot(n-1)} & , & \alpha^{-(m-2)\cdot(n-1)} & , & \ldots, & 1 \\ \cdot & & \cdot & & & \\ \cdot & & \cdot & & & \\ \cdot & & \cdot & & & \\ 1 & , & 1 & , & \ldots, & 1 \\ \cdot & & \cdot & & & \\ \cdot & & \cdot & & & \\ \cdot & & \cdot & & & \\ \alpha^{(m-1)\cdot(n-1)} & , & \alpha^{(m-2)\cdot(n-1)} & , & \ldots, & 1 \\ \alpha^{(m-1)\cdot n} & , & \alpha^{(m-2)\cdot n} & , & \ldots, & 1 \end{pmatrix} \quad (3)$$

In cases where each of data and parity check segments has one byte, it is defined as:

$$X = (x_1, x_2, x_3, x_4, x_5, x_6, x_7, x_8)^T$$

where a matrix added with the upper suffix T denotes the transposed matrix thereof. A primitive polynomial is now defined as:

$$g(X) = X^8 + X^4 + X^3 + X^2 + 1$$

A primitive root $\alpha$ of the polynomial g(X) is expressed by the following function:

$$\alpha \cdot X = T\alpha \cdot X \quad (4)$$

where the letter T represents a linear transformation operator and the character $T\alpha$ represents a linear transformed matrix of $\alpha$. The vector $T\alpha \cdot X$ is given as:

$$T\alpha \cdot X = \begin{pmatrix} x_2 \\ x_3 \\ x_4 \\ x_1 + x_5 \\ x_1 + x_6 \\ x_1 + x_7 \\ x_8 \\ x_1 \end{pmatrix} \quad (5)$$

when the linear transformed matrix $T\alpha$ is a given as:

$$T\alpha = \begin{pmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{pmatrix} \quad (6)$$

Since the matrix $T\alpha^{-1}$ is expressed as an inverse matrix of $T\alpha$, the following equation is satisfied:

$$T\alpha^{-1} = (1/T\alpha) \quad (7)$$

The linear transformed matrix $T\alpha^{-1}$ is calculated from the equations (6) and (7) and is given as:

$$T\alpha^{-1} = \begin{pmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 1 \\ 0 & 0 & 0 & 0 & 1 & 0 & 0 & 1 \\ 0 & 0 & 0 & 0 & 0 & 1 & 0 & 1 \\ 0 & 0 & 0 & 0 & 0 & 0 & 1 & 0 \end{pmatrix} \quad (8)$$

In exemplary cases where the numbers m, n, and l equal 60, 2, and 8 respectively, the parity check matrix $H_0$ and the parity generator polynomial G(x) are derived from the previous equations (2) and (3) and are expressed as follows:

$$H_0 = \begin{pmatrix} \alpha^{-118} & , & \alpha^{-116} & , & \ldots, & \alpha^{-2} & , & 1 \\ \alpha^{-59} & , & \alpha^{-58} & , & \ldots, & \alpha^{-1} & , & 1 \\ 1 & , & 1 & , & \ldots, & 1 & , & 1 \\ \alpha^{59} & , & \alpha^{58} & , & \ldots, & \alpha & , & 1 \\ \alpha^{118} & , & \alpha^{116} & , & \ldots, & \alpha^2 & , & 1 \end{pmatrix} \quad (9)$$

$$G(x) = (x - \alpha^{-2}) \cdot (x - \alpha^{-1}) \cdot (x - 1) \cdot \quad (10)$$
$$(x - \alpha) \cdot (x - \alpha^2)$$

Since $1 + 1 = 0$ in modulo-2 addition and subtraction or negative sign of a coefficient is equal to addition or positive sign of the coefficient in Galois field, the equation (10) is rewritten as:

$$G(x) = x^5 + A \cdot x^4 + B \cdot x^3 + B \cdot x^2 + A \cdot x + 1 \quad (11)$$
where
$$A = \alpha^{-2} + \alpha^{-1} + 1 + \alpha + \alpha^2 \quad (12)$$
$$B = \alpha^{-3} + \alpha^{-2} + \alpha^2 + \alpha^3 \quad (13)$$

As seen in equation (11), the generator polynomial employed in the invention is self-reciprocal.

The data series related to parity generation is given by $[D_{m-(2n+1)}, \ldots, D_1]$. A data portion of a code word is expressed as the quotient of the entire code word divided by G(x). The parity is thought to be a remainder of the division. Accordingly, the data series is expressed as follows:

$$fD(x) = D_{m-(2n+1)}x^{m-1} + \ldots + D_1 x^{2n+1} \quad (14)$$

The parity is expressed as follows:

$$r(x) = R_1 x^{2n} + R_2 x^{2n-1} + \ldots + R_{2n} x + R_{2n+1} \tag{15}$$

The code words are designed on the basis of the fact that $fD(x) + r(x)$ [$= fD(x) - r(x)$] is exactly divisible by $G(x)$.

An embodiment of this invention will be specifically described with reference to the drawings. FIG. 1 shows a coding apparatus included in a digital data system according to an embodiment of this invention.

As shown in FIG. 1, the coding apparatus includes sampling and holding (S/H) circuits 20 and 20' which sample and hold analog data signals such as analog audio signals. The sampled and held analog audio signals are converted into 2-channel 16-bit PCM (pulse code modulation) audio data digital signals by analog-to-digital (A/D) converters 21 and 21'. The 2-channel 16-bit data are rearranged into 4 sets of 8-bit data by a format converter or device 22 so that the digital data can be handled in unit of one byte. The 4-set 8-bit data are sequentially stored in a memory unit 23 in a C1 direction along rows of a memory map. The memory unit 23 includes random-access memories RAM1-RAM4 designed for data writing, parity addition, data reading, and spare respectively. The memories RAM1-RAM4 are selectively used. The memories RAM1-RAM4 form respective memory maps. In each of maps of the memories RAM1-RAM4, data are arranged in the form of a matrix having 61 rows and 59 columns.

The number m in this embodiment equals 61 in a C1 direction along rows of the map matrix and equals 59 in a C2 direction along columns, and the numbers n and l equal 2 and 8, respectively, in both the direction.

Figure 2:
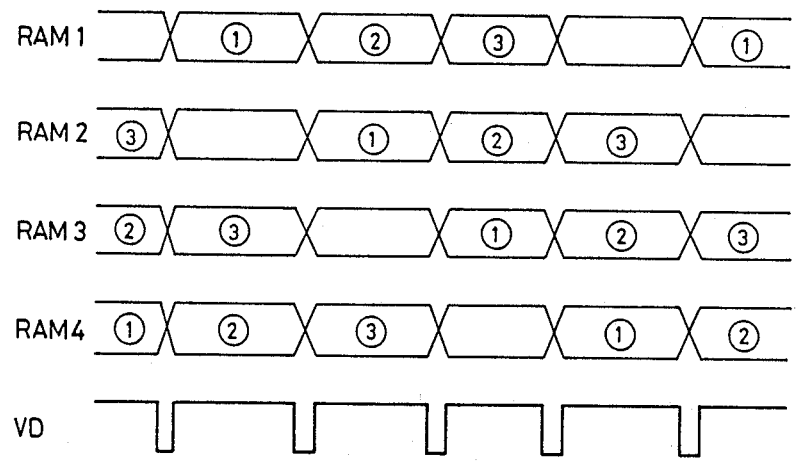
FIG. 2 is a timing diagram of selection or change of the random-access memories in the coding apparatus of FIG. 1.
Figure 3:
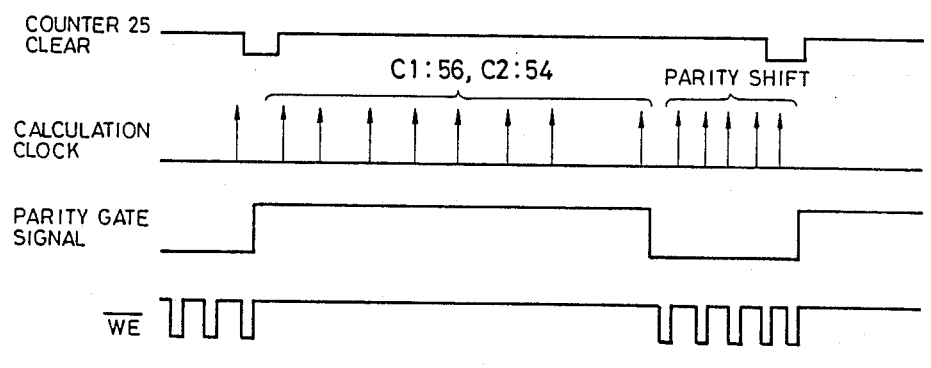
FIG. 3 is a timing diagram of several signals generated in the coding apparatus of FIG. 1.

The data are read from the memory unit 23 in the direction of code words, and parity generation and calculation are performed. The parities are added to the data. The data provided with the parities are stored in given locations of the memory unit 23. First, the data are read from the memory unit 23 in the C1 direction along rows of the map matrix, and parity calculation is performed. A counter 25 serves as a frequency divider lowering a pulse frequency of pulses supplied from a clock generator 37 by a factor of 1/61 corresponding to the number of rows in the map matrix. The frequency of pulses outputted by the counter 25 is further lowered by a counter or frequency divider 26 at a rate of 1/59 corresponding to the number of columns in the map matrix. A decoder 27 generates an address signal in accordance with pulses from the counters 25 and 26. A frequency divider 30 lowers the frequency of a video vertical synchronization signal VD by a factor of ¼. A decoder 31 generates a memory selection signal in accordance with pulses outputted by the frequency divider 30. One of the memories RAM1-RAM4 is selected in accordance with the memory selection signal. Since the memory selection signal is derived from the video vertical synchronization signal VD, the selection of the memories RAM1-RAM4 depends on the video vertical synchronization signal VD as shown in FIG. 2. In FIG. 2, duration ① shows a time during which the data from the format converter 22 are written, duration ② shows a time during which the written data are read out for parity calculation and the calculated parities are written, and a duration ③ shows a time during which the written data and parities are read out for transmission. Data or symbols denoted by the address signal are read from the selected memory in the memory unit 23 and are inputted into a parity generating circuit 35. The parity generating circuit 35 performs parity calculation related to the inputted symbols. The number of parity calculation clocks is 56 as shown in FIG. 3. After the parity calculation, produced parities are sequentially written in C1 parity locations of the memory unit 23. At this time, the decoder 27 changes a parity address signal and a write enabling signal $\overline{WE}$ to low level states as shown in FIG. 3. After the code word calculation in the C1 direction, code word calculation in the C2 direction along columns of the map matrix is performed. During the code word calculation in the C2 direction, the counter 25 serves as a frequency divider lowering a pulse frequency by a factor of 1/59 corresponding to the number of columns in the map matrix. The frequency of pulses outputted by the counter 25 is further lowered by the counter 26 at a rate of 1/61 corresponding to the number of rows in the map matrix. An address signal depending on a code word formation is outputted in a way similar to the way in the code word calculation in the C1 direction. Parity calculation is performed in a way similar to the way in the code word calculation in the C1 direction. During the code word calculation along the C2 direction, the number of calculation clocks is 54 as shown in FIG. 3. A counter or frequency divider 36 derives a pulse signal from the pulse signal outputted by the counter 26. The frequency of pulses outputted by the counter 36 equals a half of the frequency of pulses outputted by the counter 26. The functions of the counters 25 and 26 for the C1 direction calculation and the functions of the counters 25 and 26 for the C2 direction calculation are changed in accordance with the pulses outputted by the counter 36. Clear pulses are applied to the counter 25 occur as shown in FIG. 3. The clock generator 37 derives clock signals from the signal VD and a video horizontal synchronization signal HD. Clock signals are transmitted from the clock generator 37 to a counter 38, the device 22, and a decoder 39. The counter 38 serves as a frequency divider lowering the frequency of pulses from the clock generator 37 by a factor of 1/735X4. The output signal from the counter 38 is applied to the decoder 31. The decoder 39 also receives the signals from the counters 25, 26, and 36. The decoder 39 generates a parity gate signal in accordance with the inputted signals. The parity gate signal is applied to the devices 27 and 35. As shown in FIG. 3, the parity gate signal is in an ON state during parity calculation and in an OFF state during parity transmission.

A counter or frequency divider 40 derives a pulse signal from a clock signal outputted by the clock generator 37. The frequency of pulses outputted by the counter 40 is smaller than the frequency of the clock signal by a factor 1/3599 corresponding to the total number of transmitted symbols in one video field period. A decoder 41 generates an address signal in accordance with the pulse signals outputted by the clock generator 37 and the counter 40. This address signal depends on a transmission sequence. Code words made by adding parities to data are stored in the memory unit 23. The code words denoted by the address signal from the decoder 41 are sequentially read from the memory unit 23 and are then transmitted to a format converter 42. The code words are subjected to format conversion process in the device 42 in which a header portion including synchronizing bits are added to a predetermined number of the code words. A parallel-to-serial (P/S) converter 43 changes 8-bit parallel signals into a bit sequence. The bit sequence is subjected to frequency modulation (FM) by a modulator 44 and is thus converted into an FM signal. An adder 45 superimposes the FM signal on a video signal. The devices 42 and 43 receive the clock signal from the clock generator 37.

Figure 4:
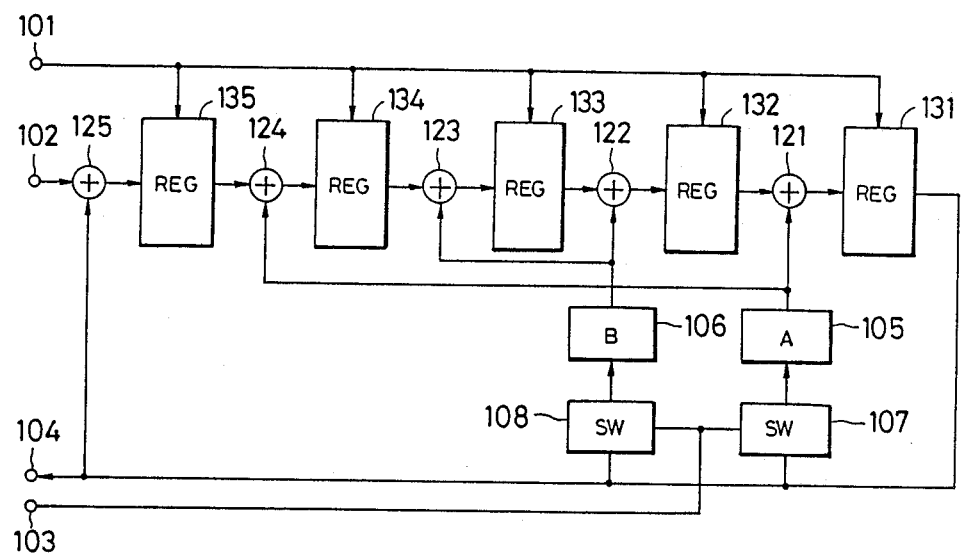
FIG. 4 is a block diagram of the parity generation circuit in the coding apparatus of FIG. 1.

As shown in FIG. 4, the parity generating circuit 35 has a first input terminal 101 subjected to a clock signal generated by the clock generator 37 or the decoder 39 (see FIG. 1). A second input terminal 102 of the parity generating circuit 35 is subjected to a data signal outputted from the memory unit 23 (see FIG. 1). The data $D_{m-(2n+1)}$, $D_{m-(2n+2)}$, ..., $D_1$ are sequentially applied to the data input terminal 102 such that the k bits constituting each of the data are applied in parallel. A third input terminal 103 o the parity generating circuit 35 is subjected to the parity gate signal outputted from the decoder 39 (see FIG. 1). An output terminal 104 of the parity generating circuit 35 is subjected to a parity signal generated by the parity generating circuit 35. The parity signal is transmitted from the parity generating circuit 35 to the memory unit 23 (see FIG. 1) via the output terminal 104.

The parity generating circuit includes modulo-2 adders (EXCLUSIVE-OR circuits) 121–125 and registers 131–135. A second input terminal of the adder 125 is connected to the data input terminal 102. A first input terminal of the adder 125 is connected to an output terminal of the register 131. An output terminal of the adder 125 is connected to an input terminal of the register 135. An output terminal of the register 135 is connected to a first input terminal of the adder 124. A second input terminal of the adder 124 is connected to an output terminal of a multiplier 105. An output terminal of the adder 124 is connected to an input terminal of the register 134. An output terminal of the register 134 is connected to a first input terminal of the adder 123. A second input terminal of the adder 123 is connected to an output terminal of a multiplier 106. An output terminal of the adder 123 is connected to an input terminal of the register 133. An output terminal of the register 133 is connected to a first input terminal of the adder 122. A second input terminal of the adder 122 is connected to the output terminal of the multiplier 106. An output terminal of the adder 122 is connected to an input terminal of the register 132. An output terminal of the register 132 is connected to a first input terminal of the adder 121. A second input terminal of the adder 121 is connected to the output terminal of the multiplier 105. An output terminal of the adder 121 is connected to an input terminal of the register 131. An input terminal of the multiplier 105 is connected to the output terminal of the register 131 via a switch 107. An input terminal of the multiplier 106 is connected to the output terminal of the register 131 via a switch 108. Control terminals of the switches 107 and 108 are connected to the input terminal 103 so that they receive the parity gate signal. The switches 107 and 108 are controlled in accordance with the parity gate signal. Specifically, the switches 107 and 108 are closed during parity calculation and are opened during parity transmission. Clock input terminals of the registers 131–135 are connected in common to the terminal 101 so that they receive the clock signal. The output terminal of the register 131 is connected to the parity output terminal 104.

During parity calculation, the parity generating circuit 35 operates as follows. The data applied to the input terminal 102 travel to the adder 125. The data from the input terminal 102 and the data from the register 131 are modulo-2 added by the device 125 to form modified data which are supplied to and held by the register 135. The data outputted from the register 135 travel to the adder 124. The data from the register 135 and the data from the multiplier 105 are modulo-2 added by the device 124 to form modified data which are supplied to and held by the register 134. The data outputted from the register 134 travel to the adder 123. The data from the register 134 and the data from the multiplier 106 are modulo-2 added by the device 123 to form modified data which are supplied to and held by the register 133. The data outputted from the register 133 travel to the adder 122. The data from the register 133 and the data from the multiplier 106 are modulo-2 added by the device 122 to form modified data which are supplied to and held by the register 132. The data outputted from the register 132 travel to the adder 121. The data from the register 132 and the data from the multiplier 105 are modulo-2 added by the device 121 to form modified data which are supplied to and held by the register 131. The data outputted from the register 131 travel to the adder 125, and to the multipliers 105 and 106 via the switches 107 and 108. Movements of the data through the registers 131–135 are executed at timings determined by the clock signal applied to the shift registers 131–135 via the terminal 101. The data from the register 131 are multiplied by a preset feedback coefficient A in the device 105 to form multiplied data which are supplied to the adders 121 and 124. The data from the register 131 are multiplied by a preset feedback coefficient B in the device 106 to form multiplied data which are supplied to the adders 122 and 123. The feedback coefficients A and B are predetermined in accordance with the previously-mentioned equations (12) and (13). When the final data $D_1$ comes into the input terminal 102, the parities P5-P1 given by the equation (15) are generated in the registers 131–135. It should be noted that the parities P5-P1 correspond to the coefficients $R_1 - R_{2n+1}$ in the equation (15).

The parities P5-P1 are sequentially read out and are transmitted into the memory unit 23 (see FIGS. 1 and 3).

Figure 5:
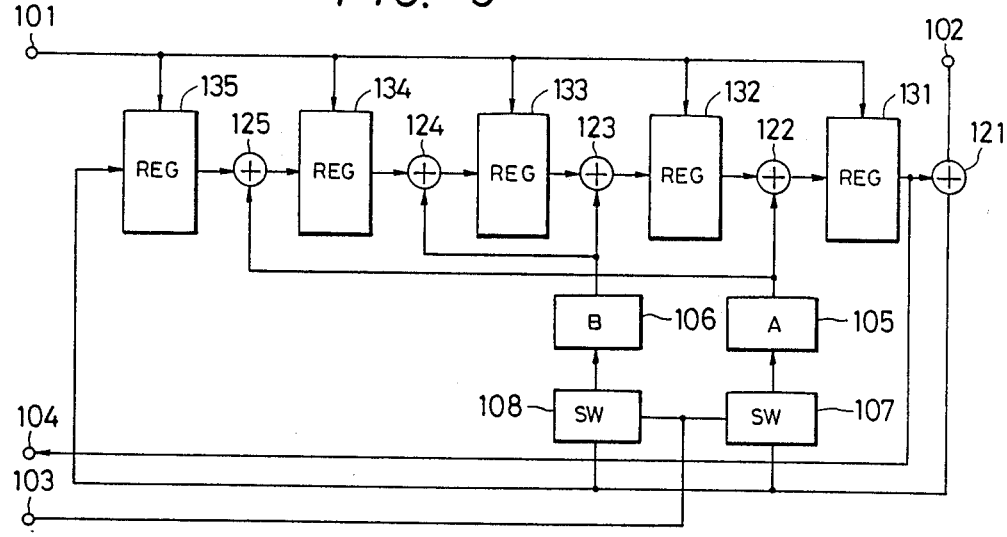
FIG. 5 is a block diagram of a modified parity generation circuit.

The parity generating circuit 35 may be modified as shown in FIG. 5. In the parity generating circuit 35 of FIG. 5, the data $D_{m-(2n+1)}$, $D_{m-(2n+2)}$, ..., $D_1$ are sequentially applied to the data input terminal 102. The adder 121 performs modulo-2 addition of the inputted data and the contents of the register 131. The result of this addition is supplied via the multiplier 105 to the adders 122 and 125, and is supplied via the multiplier 106 to the adders 123 and 124. The adders 122-125 perform respective modulo-2 additions. The results of these additions are supplied to the respective registers 131–134. The output of the adder 121 is supplied to the register 135.

In the parity generating circuit shown in FIGS. 4 and 5, the number of either the address or the registers is $2n+1$, and the parity generating circuit 35 has only two ($=2$) multipliers and is therefore considerably simple as compared with a conventional parity generating circuit which requires five ($=2n+1$) multipliers.

The syndrome is determined by use of the check matrix H0 of the equation (9). When the symbols of the data and parities of the [m,m-(2n+1)] Reed-Solomon codes are defined as $W=[C_{m-1}, C_{m-2}, ..., C_0]$, the syndrome is lgiven by the following equations.

$$S_{-n} = C_{m-1} \cdot a^{-(m-1)n} + C_{m-2} \cdot a^{-(m-2)n} + \ldots + C_0 \qquad (16)$$

$$S_{-(n-1)} = C_{m-1} \cdot a^{-(m-1)(n-1)} + C_{m-2} \cdot a^{-(m-2)(n-1)} + \ldots + C_0$$

$$\vdots$$

$$S_0 = C_{m-1} + C_{m-2} + \ldots + C_0$$

$$\vdots$$

$$S_{(n-1)} = C_{m-1} \cdot a^{(m-1)(n-1)} + C_{m-2} \cdot a^{(m-2)(n-1)} + \ldots + C_0$$

$$S_n = C_{m-1} \cdot a^{(m-1)n} + C_{m-2} \cdot a^{(m-2)n} + \ldots + C_0$$

As understood from the equations (16), the syndrome has rows symmetrical with each other.

Figure 6:
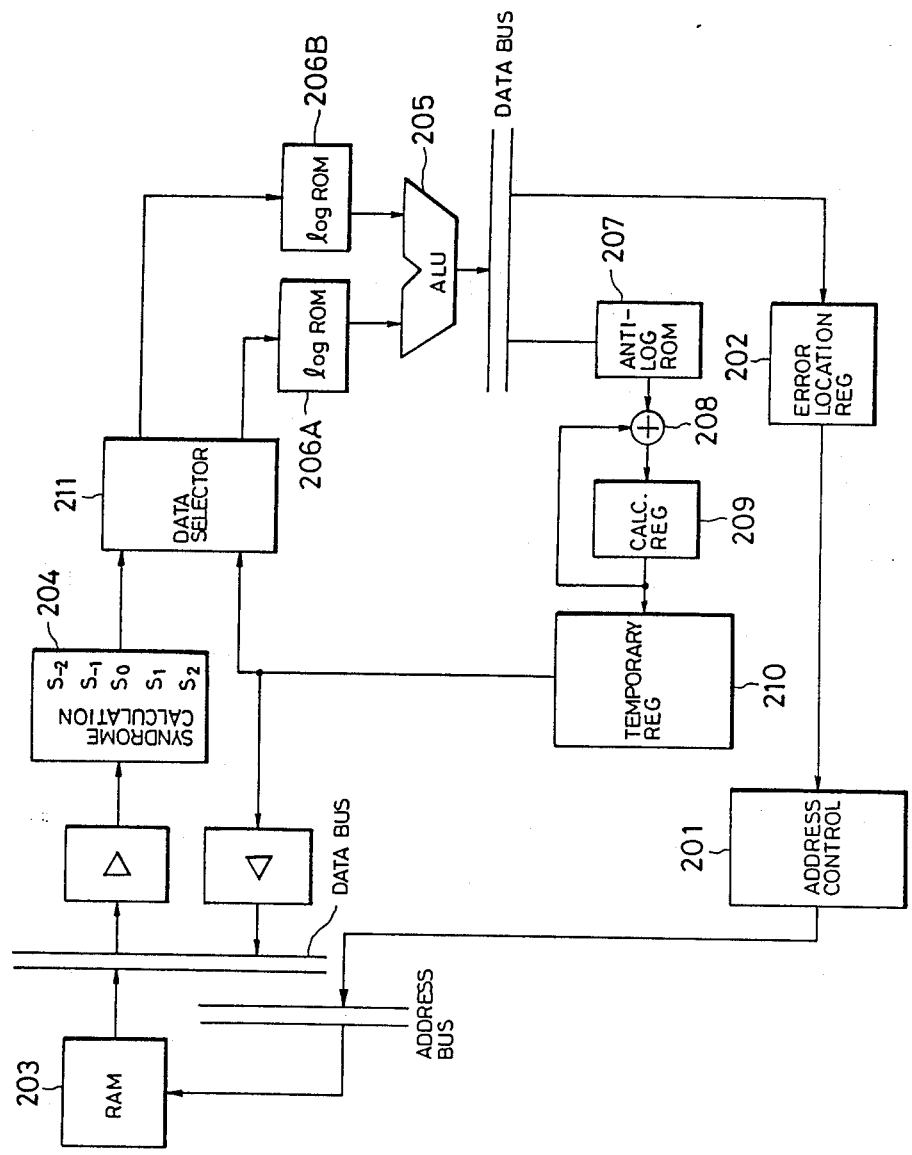
FIG. 6 is a general block diagram of an error correction circuit included in the digital data system according to the embodiment of this invention.
Figure 7:
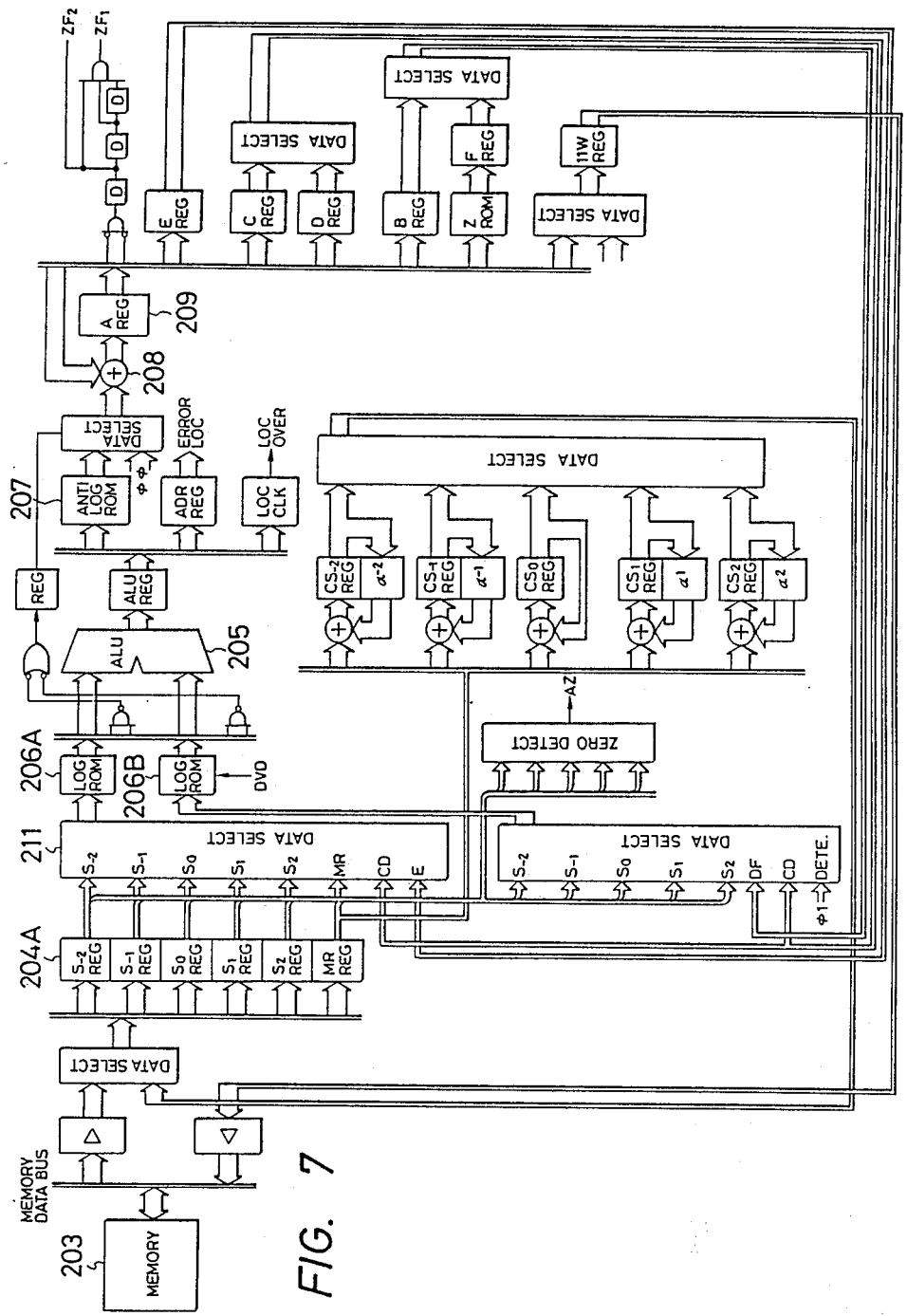
FIG. 7 is a detailed block diagram of a portion of the error correction circuit of FIG. 6.

FIG. 6 shows an error correction circuit included in the digital data system according to the embodiment of this invention. FIG. 7 is a detailed block diagram of a portion of the error correction circuit of FIG. 6. In the error correction circuit of FIGS. 6 and 7, addresses necessary for error correcting calculation are generated in accordance with word sequence of code words. When an error is present, an address control device 201 generates an address in accordance with a signal outputted by an error location register 202 and corrected data are written in a segment of a random-access memory (RAM) 203 denoted by the generated address. Error correcting calculations are performed repeatedly and alternately in the C1 direction and in the C2 direction.

Syndrome calculation is performed by a circuit 204 in preparation for error correction. During syndrome calculation, the symbols of code words are sequentially read from the RAM 203 in word order, and the values $S_{-2}$-$S_2$ of the respective syndromes are stored in registers 204A within the syndrome calculation circuit 204.

Errors in code words are detected by use of the syndrome values $S_{-2}$-$S_2$. Code calculation via an arithmetic and logical unit (ALU) 205 is described hereinafter. The character $\alpha$ handled as a code is defined as a primitive root of a Galois field $GL(2^8)$ and forms a code. The value of a symbol is defined as an exponent of the value $\alpha$. In respect of four rules of calculation between symbols, multiplication and division can be performed as addition and subtraction between symbol values. During addition and subtraction between symbols, the logarithm values of the respective symbols (vector representation defined in $GF(2^8)$) are determined by referring to log read-only memories (ROM) 206A and 206B, and addition and subtraction of the logarithm values are performed in the ALU 205. The results of the addition and subtraction of the logarithm values are converted into antilogarithm values by an antilogarithm read-only memory (ROM) 207. The output from the antilogarithm ROM 207 is applied to a combination of a modulo-2 adder 208, a calculation or arithmetic register 209, and a temporary register 210. The output from the temporary register 210 and the output from the syndrome calculation circuit 204 are inputted into a data selector 211. Outputs from the data selector 211 are applied to the log ROMs 206A and 206B. The error detection determines whether there is no error, one error, two errors, or three or more errors by referring to simultaneous equations of the syndromes $S_{-2}$-$S_2$.

[NO ERROR]

When $S_{-2}=S_{-1}=S_0=S_1=S_2=0$, there is no error.

[ONE ERROR]

There is one error when the following conditions and equations are satisfied. Each of $S_{-2}$, $S_{-1}$, $S_0$, $S_1$, and $S_2$ differs from 0, and $$S_{-1}^2 + S_{-2} \cdot S_0 = 0$$

$$S_0^2 + S_{-1} \cdot S_1 = 0$$

$$S_1^2 + S_0 \cdot_2 = 0$$

[TWO OR MORE ERRORS]

There are two errors when the following equations are satisfied.

$$S_{-2}^2 + S_{-2} \cdot S_0 \text{ is not equal to } 0.$$

$$S_0^2 + S_{-1} \cdot S_1 \text{ is not equal to } 0.$$

$$S_1^2 + S_0 \cdot S_2 \text{ is not equal to } 0.$$

$$S_2 + X_1 \cdot S_1 + X_2 \cdot S_0 = 0$$

where the values $X_1$ and $X_2$ are solutions of the following equations.

$$S_0 + X_1 \cdot S_{-1} + X_2 \cdot S_{-2} = 0$$

$$S_0 + X_1 \cdot S_0 + X_2 \cdot S_{-1} = 0$$

There are three or more errors when the following equations are satisfied.

$$S_{-2}^2 + S_{-2} \cdot S_0 \text{ is not equal to } 0.$$

$$S_0^2 + S_{-1} \cdot S_1 \text{ is not equal to } 0.$$

$$S_1^2 + S_0 \cdot S_2 \text{ is not equal to } 0.$$

$$S_2 + X_1 \cdot S_1 + X_2 \cdot S_0 \text{ is not equal to } 0.$$

where the values $X_1$ and $X_2$ are solutions of the following equations.

$$S_0 + X_1 \cdot S_{-1} + X_2 \cdot S_{-2} = 0$$

$$S_0 + X_1 \cdot S_0 + X_2 \cdot S_{-1} = 0$$

[SYNDROME IN ONE ERROR]

Assuming that in $W = [C_{59} \ldots C_0]$, $C_i$ is erroneously reproduced as $C_i'$ and the error vector is $e_i$, the following equations are satisfied.

$$C_i' = C_i + e_i.$$

$$S_{-2} = \alpha^{-2i} \cdot e_i$$

$$S_{-1} = \alpha^{-i} \cdot e_i$$

$$S_0 = e_i$$

$$S_1 = \alpha^i \cdot e_i$$

$$S_2 = \alpha^{2i} \cdot e_i$$

Accordingly, the following conditions and equations are satisfied. Each of $S_{-2}$, $S_{-1}$, $S_0$, $S_1$, and $S_2$ differs from 0.

$$S_{-1}^2 + S_{-2} \cdot S_0 = 0$$

$$S_0^2 + S_{-1} \cdot S_1 = 0$$

$$S_1^2 + S_0 \cdot S_2 = 0$$

[CORRECTION OF ONE ERROR]

Error location i is calculated by referring to the following equation.

$$i = \log_{60}(S_1/S_0)$$

The correct value $C_i$ is restored or reconstructed by referring to the following equation.

$$C_i = C_i' + e_i = C_i' + S_0$$

[SYNDROME IN TWO ERRORS]

It is assumed that in $W = [C_{59} \ldots C_0]$, $C_i$ and $C_j$ are wrong and $C_i' = C_i + e_i$, $C_j' = C_j + e_j$.

$$S_{-2} = \alpha^{-2i} \cdot e_i + \alpha^{-2j} \cdot e_j$$

$$S_{-1} = \alpha^{-i} \cdot e_i + \alpha^{-j} \cdot e_j$$

$$S_0 = e_i + e_j$$

$$S_1 = \alpha^i \cdot e_i + \alpha^j \cdot e_j$$

$$S_2 = \alpha^{2i} \cdot e_i + \alpha^{2j} \cdot e_j$$

Assuming the values $X_1$ and $X_2$ to be defined as follows, $$\alpha^i + \alpha^j = X_1$$

$$\alpha^i \cdot \alpha^j = X_2$$

the following equations are obtained.

$$S_0 + X_1 \cdot S_{-1} + X_2 \cdot S_{-2} = 0$$

$$S_1 + X_1 \cdot S_0 + X_2 \cdot S_{-1} = 0$$

$$S_2 + X_1 \cdot S_1 + X_2 \cdot S_0 = 0$$

The values $X_1$ and $X_2$ are expressed as follows.

$$X_1 = (S_0 \cdot S_{-1} + S_1 \cdot S_{-2})/(S_{-1}^2 + S_0 \cdot S_{-2})$$

$$X_2 = (S_0^2 + S_1 \cdot S_{-1})/(S_{-1}^2 + S_0 \cdot S_2)$$

The number of errors are determined by use of the values $X_1$ and $X_2$, and the polynomial $S_2 + X_1 \cdot S_1 + X_2 \cdot S_0$ as described previously.

[CORRECTION OF TWO ERRORS]

$$\alpha^i + \alpha^j = X_1$$

$$\alpha^i \cdot \alpha^j = X_2$$

These equations cause the following equations.

$$(\alpha^i)^2 + X_1 \cdot \alpha^i + X_2 = 0$$

$$(\alpha^j)^2 + X_1 \cdot \alpha^j + X_2 = 0$$

Letting $\alpha^i$ be y, the upper equation is written as:

$$y^2 + X_1 \cdot y + X_2 = 0$$

This quadratic equation is solved as follows. Since a quadratic equation in $GF(2^8)$ can not be solved analytically, transformations are performed so as to effectively use ROM table. When $z = y/X_1$, the following equations are obtained.

$$X_1^2 \cdot z^2 + X_1^2 \cdot z + X_2 = 0$$

$$z^2 + z + (X_2/X_1^2) = 0$$

In view of these transformations, the ROM table is prepared and designed wherein the term $(X_2/X_1^2)$ is used as a parameter. The value z is determined by referring to the ROM table. The value $\alpha^i$ is determined by referring to the following equation:

$$y = X_1 \cdot z = \alpha^i$$

The value $\alpha^j$ is determined by referring to the following equation:

$$\alpha^j = X_1 \alpha^i$$

The values i and j are determined by referring to the logarithm table (ROM) and are given as follows:

$$i = \log_\alpha \alpha^i$$

$$j = \log_\alpha \alpha^j$$

The syndromes $S_0$ and $S_1$ are given as follows:

$$S_0 = e_i + e_j$$

$$S_1 = \alpha^i \cdot e_i + \alpha^j \cdot e_j$$

These equations cause the following equations.

$$e_i = (\alpha^j \cdot S_0 + S_1)/(\alpha^i + \alpha^j) = (\alpha^j \cdot S_0 + S_1)/X_1$$

$$e_j = (\alpha^i \cdot S_0 + S_1)/X_1$$

The correct values $C_i$ and $C_j$ are restored or reconstructed by referring to the following equations:

$$C_i = C_i' + e_i$$

$$C_j = C_j' + e_j$$

Figure 8:
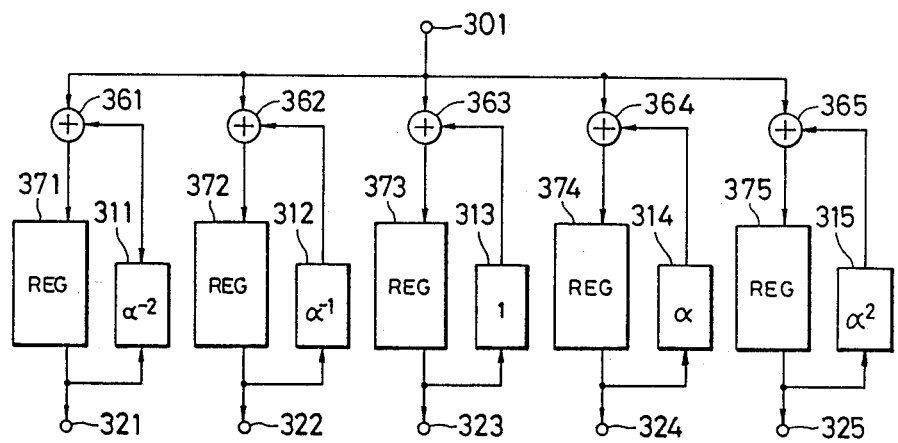
FIG. 8 is a block diagram of the syndrome production circuit in the error correction circuit of FIG. 6.

As shown in FIG. 8, the syndrome calculation circuit includes an input terminal 301 sequentially subjected to respective symbols of Reed-Solomon code words provided with parities. The terminal 301 are connected to first input terminals of modulo-2 adders 361-365. Output terminals of the adders 361-365 are connected to input terminals of registers 371-375 respectively. Output terminals of the registers 371-375 are connected to input terminals of multipliers 311-315 respectively. Output terminals of the multipliers 311-315 are connected to second input terminals of the adders 361-365 respectively. The syndrome calculation circuit 204 has output terminals 321-325 connected to the output terminals of the registers 371-375 respectively. It should be noted that the syndrome calculation circuit of FIG. 8 is designed for the Reed-Solomon code having a parity number 2n+1 equal to 5.

The devices 311-315 multiply the output signals from the registers 371-375 by feedback coefficients $\alpha^{-2}$, $\alpha^{-1}$, 1, $\alpha$, and $\alpha^2$ respectively. Outputs from the multipliers 311-315 are modulo-2 added to the input code word signal by the adders 361-365 respectively. Outputs from the adders 361-365 are applied to the registers 371-375 respectively. When the final symbol $C_0$ is inputted, he syndromes $S_{-2}$, $S_{-1}$, $S_0$, $S_1$, and $S_2$ are generated in the registers 371-375 and are outputted via the terminals 321-325 respectively.

Naturally, the multiplier 313 having the feedback coefficient one may be omitted in practice, and the output signal of the register 373 may be directly applied to the second input terminal of the adder 363.

Since the multipliers 311-315 use the feedback coefficients $\alpha^{-2}$, $\alpha^{-1}$, 1, $\alpha$, and $\alpha^2$ respectively, the multipliers 311-315 require 5, 3, 0, 3, and 5 EXCLUSIVE OR circuits respectively. The total number of required EXCLUSIVE OR circuits is 16, so that the syndrome calculation circuit of FIG. 8 is relatively simple as compared with a conventional syndrome calculation circuit which requires 26 EXCLUSIVE-OR circuits.

When the order of symbols is reversed and thus $W' = [C_0, \ldots, C_{m-2}, C_{m-1}]$, the syndrome is given by the following equations.

$$
\begin{aligned}
S_{-n}' &= C_0 \cdot \alpha^{-(m-1)n} + \ldots + C_{m-2} \cdot \alpha^{-n} + C_{m-1} \\
S_{-(n-1)}' &= C_0 \cdot \alpha^{-(m-1)(n-1)} + \ldots + C_{m-2} \cdot \alpha^{-(n-1)} + C_{m-1} \\
&\vdots \\
S_0' &= C_0 + \ldots + C_{m-2} + C_{m-1} \\
&\vdots \\
S_{(n-1)}' &= C_0 \cdot \alpha^{(m-1)(n-1)} + \ldots + C_{m-2} \cdot \alpha^{(n-1)} + C_{m-1} \\
S_n' &= C_0 \cdot \alpha^{(m-1)n} + \ldots + C_{m-2} \cdot \alpha^n + C_{m-1}
\end{aligned} \tag{17}
$$

When sides of the equations of $S_{-n}'$, $S_{-(n-1)}'$, $\ldots$, $S_0'$, $\ldots$ $S_{n-1}$, and $S_n'$ are multiplied by $\alpha^{(m-1)n}$, $\alpha^{(m-1)(n-1)}$, $\ldots$, $\alpha^0 (=1)$, $\ldots$, $\alpha^{-(m-1)(n-)}$, and $\alpha^{-(m-1)n}$ respectively, the following equations are obtained.

$$
\begin{aligned}
\alpha^{(m-1)n} \cdot S_{-n}' &= C_0 + \ldots + C_{m-1} \cdot \alpha^{(m-1)n} \\
&= S_n \\
\alpha^{(m-1)(n-1)} \cdot S_{-(n-1)}' &= S_{n-1} \\
&\vdots \\
S_0' &= S_0 \\
&\vdots \\
\alpha^{-(m-1)(n-1)} \cdot S_{n-1}' &= S_{-(n-1)} \\
\alpha^{-(m-1)n} \cdot S_n' &= S_{-n}
\end{aligned} \tag{18}
$$

When one error occurs and the symbol $C_i$ changes to $C_i'$, the following equation is given.

$$C_i' = C_i + e_i$$

When the syndrome is calculated in view of this equation, the syndrome is expressed by the following equations in the case of the normal order.

$$
\begin{aligned}
S_1 &= \alpha^i \cdot e_i \\
S_0 &= e_i \\
S_{-1} &= \alpha^{-i} \cdot e_i
\end{aligned} \tag{19}
$$

The syndrome is expressed by the following equations in the case of the reverse order.

$$
\begin{aligned}
S_1' &= S_{-1} \cdot \alpha^{m-1} = \alpha^{(m-1)-i} \cdot e_i \\
S_0' &= S_0 = e_i \\
S_{-1}' &= S_1 \cdot \alpha^{-(m-1)} = \alpha^{-(m-1)+i} \cdot e_j
\end{aligned} \tag{20}
$$

When the error location L is calculated, the error location L is given by the following equation in the case of the normal order.

$$
\begin{aligned}
L &= \log_\alpha(S_1/S_0) \\
&= \log_\alpha(\alpha^i \cdot e_i/e_i) \\
&= i
\end{aligned} \tag{21}
$$

The error location L is given by the following equation in the case of the reverse order.

$$
\begin{aligned}
L &= \log_\alpha(S_1'/S_0') \\
&= \log_\alpha(\alpha^{(m-1)-i} \cdot e_i/e_i) \\
&= (m-1) - i
\end{aligned} \tag{22}
$$

Figure 9:
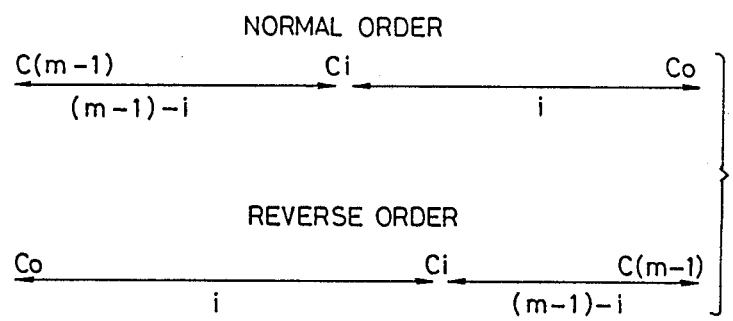
FIG. 9 is a diagram showing error locations in code words.

As shown in FIG. 9, in the case of the normal order, the location of the symbol $C_i$ is the i-th place from the symbol $C_0$. In the case of the reverse order, the location of the symbol $C_i$ is the (m-1)-i-th place from the symbol $C_{m-1}$. These results demonstrate that the locations of the error symbol $C_i$ in the normal and reverse orders agree with each other. Accordingly, even when the symbols are inputted in the reverse order, the error location can be determined correctly. In the case of two errors, the error locations can also be determined correctly.

In this way, even when the symbols are sequentially applied to the input terminal 301 of the syndrome calculation circuit of FIG. 8 in the reverse order, the syndrome can be generated and there is no problem in error correction. Accordingly, the degree of freedom of the syndrome calculation circuit is relatively high, and the degree of freedom of access to the memory storing code words is relatively high.

What is claimed is:

1. In a digital data processing system generating parity in accordance with digital data supplied thereto, adding the parity to the digital data to produce a coded signal, recording the coded signal, reproducing the recorded signal, decoding the reproduced signal and correcting code word errors to reproduce the digital data, the improvement wherein:

a number of symbols of the digital data equals m-(2n+1) and a number of symbols of the parity equals 2n+1, and each of the symbols has l bits, where the character n denotes a natural number, the character m denotes a natural number greater than 2n+1, and the character l denotes a natural number equal to or greater than 2;

coding and decoding are performed by use of Reed-Solomon code, and a parity generator polynomial G(x) of the Reed-Solomon code is given as:

$$G(x) = (x - \alpha^{-n}) \cdot (x - \alpha^{-(n-1)}) \cdots$$
$$(x - \alpha^{-1}) \cdot (x - 1) \cdot (x - \alpha^1) \cdots$$
$$(x - \alpha^{n-1}) \cdot (x - \alpha^n)$$

and, a code word W of the Reed-Solomon code is given as:

$$W = [C_{m-1}, \ldots, C_1, C_0];$$

calculation coefficients in coding and decoding which are obtained via the parity generator polynomial are expressed as coefficients of x in the following equation:

$$G(x) = x^{2n+1} + A_1 x^{2n} + A_n x^{n+1} + A_n x^n + A_{n-1} x^{n-1} + \ldots + A_1 x + 1;$$

a check matrix H0 of the Reed-Solomon code is given as:

$$H_0 = \begin{bmatrix} \alpha^{-(m-1)\cdot n}, & \alpha^{-(m-2)\cdot n}, & \ldots, & 1 \\ \alpha^{-(m-1)\cdot(n-1)}, & \alpha^{-(m-2)\cdot(n-1)}, & \ldots, & 1 \\ \cdot & \cdot & & \cdot \\ \cdot & \cdot & & \cdot \\ \cdot & \cdot & & \cdot \\ 1, & 1, & \ldots, & 1 \\ \cdot & \cdot & & \cdot \\ \cdot & \cdot & & \cdot \\ \alpha^{(m-1)\cdot(n-1)}, & \alpha^{(m-2)\cdot(n-1)}, & \ldots, & 1 \\ \alpha^{(m-1)\cdot n}, & \alpha^{(m-2)\cdot n}, & \ldots, & 1 \end{bmatrix}$$

where the character $\alpha$ represents a primitive root of a Galois field $GL(2^l)$, and comprising:

an encoder having a parity circuit which has 2n+1 registers, 2n+1 modulo-2 adders each having a first input terminal and a second input terminal, and n multipliers each multiplying an input vector applied thereto by a predetermined matrix and outputting the multiplied vector, the 2n+1 registers being alternately connected with the 2n+1 adders in series to form a loop circuit, outputs of the registers being applied to the respective first input terminals of the adders, said symbols of the digital data being sequentially applied to the second input terminal of a specific adder from among the 2n+1 adders, all the n multipliers being applied with the same as the input applied to the first input terminal of the specific adder or with the output of the specific adder, the multiplied vector from each of the multipliers being applied to the second input terminals of each pair of adders from among said adders exclusive of the specific adder, said each pair of adders being k-th adder and (2n+3-k)-th adder, starting to count from the specific adder along the loop circuit, wherein k=2,3, ... ,n, or n+1.

2. The digital data processing system of claim 1 wherein the code word W has data symbols $(C_{m-1}, \ldots, C_{2n+1})$ and parity symbols $(C_{2n}, \ldots, C_0)$.

3. The digital data processing system of claim 1 wherein the code word W has parity symbols $(C_{m-1}, \ldots, C_{m-(2n+1)})$ and data symbols $(C_{m-(2n+2)}, \ldots, C_0)$.

4. The digital data processing system of claim 3 wherein the data symbols $(C_{m-(2n+2)}, \ldots, C_0)$ of the code word W is reversed in order to produce a code word W, expressed as:

$$W' = [C_0, C_1, \ldots, C_{m-1}]$$

and the parity symbols $(C_{m-1}, \ldots, C_{m-(2n+1)})$ are produced by use of a reciprocal polynomial G'(x) with respect to the parity generator polynomial G(x), the reciprocal polynomial G'(x) being given as:

$$G'(x) + X^{2n+1} \cdot G(1/x) = G(x).$$

5. In a digital data processing system generating parity in accordance with digital data supplied thereto, adding the parity to the digital data to produce a coded signal, recording the coded signal, reproducing the recorded signal, decoding the reproduced signal and correcting code word errors to reproduce the digital data, the improvement wherein:

a number of symbols of the digital data equals m-(2n+1) and a number of symbols of the parity equals 2n+1, and each of the symbols has l bits, where the character n denotes a natural number, the character m denotes a natural number greater than 2n+1, and the character l denotes a natural number equal to or greater than 2;

coding and decoding are performed by use of Reed-Solomon code; comprising:

an encoder having a parity generating circuit which has 2n+1 registers, 2n+1 modulo-2 adders each having a first input terminal and a second input terminal, and n multipliers each multiplying an input vector applied thereto by predetermined matrix and outputting the multiplied vector, the 2n+1 registers being alternately connected with the 2n+1 adders in series to form a loop circuit, outputs of the registers being applied to the respective first input terminals of the adders, said symbols of the digital data being sequentially applied to the second input terminal of a specific adder from among the 2n+1 adders, all the n multipliers being applied either with an input which is identical to the input applied to the first input terminal of the specific adder or with the output of the specific adder, the multiplied vector from each of the multipliers being applied to the second input terminals of each pair of adders from among said adders exclusive of the specific adder, said each pair of adders being a k-th adder and a (2n+3-k)-th adder, counting from the specific adder along the loop circuit, wherein k=2,3, ..., n, or n+1.

6. A digital data processing system as recited in claim 5 wherein said encoder comprises a plurality of sample-and hold circuits for sampling and holding analog data signals;

analog-to-digital converting means for converting the analog data samples held in said sample-and-hold circuits to digital data; and memory means comprising a plurality of memories for storing the digital data arranged in a form of a matrix.

7. A digital data processing system as recited in claim 6 wherein said analog-to-digital converters convert the analog data samples to a first form of digital data, and further comprising format converting means for rearranging said first form of digital data to a second digital form.

8. A digital data processing system as recited in claim 6 wherein said parity generating circuit is operable for reading the data from said memory means and for providing two-directional parity information thereto, said parity generating circuit further including first frequency dividing means for reducing a frequency of a clock signal by a factor corresponding to a number of rows in the matrix stored in said memory means;

address decoder means for generating an address signal in response to pulses from said first frequency dividing means;

second frequency dividing means for reducing a frequency of a video vertical synchronization signal;

decoder means for generating a memory selection signal in response to pulses output by said second frequency dividing means for selecting one of said memories of said memory means in response to said video vertical synchronization signal, and parity calculating means for calculating and writing parity values generated for said digital data in said memory means.

9. A digital data processing system as recited in claim 8 further comprising clock signal generating means for generating said clock signal from said video vertical synchronization signal and from a video horizontal synchronization signal;

third frequency dividing means for reducing the frequency of said clock signal and for applying the reduced frequency signal to said decoder means; and decoder timing control means responsive to signals from said first frequency dividing means and from further frequency signals for generating a parity gate signal and for providing said parity gate signal to said address decoder means and said parity calculating means.

* * * * *